United States Patent [19]

Kadosh et al.

[11] Patent Number: 5,714,394
[45] Date of Patent: Feb. 3, 1998

[54] METHOD OF MAKING AN ULTRA HIGH DENSITY NAND GATE USING A STACKED TRANSISTOR ARRANGEMENT

[75] Inventors: Daniel Kadosh, Austin; Mark I. Gardner, Cedar Creek, both of Tex.

[73] Assignee: Advanced Micro Devices, Inc., Sunnyvale, Calif.

[21] Appl. No.: 745,029

[22] Filed: Nov. 7, 1996

[51] Int. Cl.$^6$ .................. H01L 21/265; H01L 21/70; H01L 27/00

[52] U.S. Cl. .................. 437/21; 437/57; 437/915

[58] Field of Search .................. 437/208, 21, 915, 437/51, 61, 62, 40 TFT, 41 TFT, 34, 57, 56; 148/DIG. 164; 257/347, 350, 351

[56] References Cited

U.S. PATENT DOCUMENTS

| | | | |
|---|---|---|---|
| 4,768,076 | 8/1988 | Aoki et al. | 437/57 |
| 4,902,637 | 2/1990 | Kondou et al. | 437/915 |
| 5,348,899 | 9/1994 | Dennison et al. | 437/915 |
| 5,612,552 | 3/1997 | Owens | 257/347 |

*Primary Examiner*—Brian Dutton
*Attorney, Agent, or Firm*—Kevin L. Daffer; Conley, Rose & Tayon

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds to the overall circuit density, but does so with emphasis placed on high performance interconnection between devices on separate levels. The interconnect configuration is made as short as possible between features within one transistor level to features within another transistor level. This interconnect scheme lowers resistivity by forming a gate conductor of an upper level transistor upon a gate conductor of a lower level transistor. Alternatively, the gate conductors can be a single conductive entity. In order to abut the gate conductors together, or form a single gate conductor, the upper level transistor is inverted relative to the lower level transistor. In addition to the inverted, shared gate conductor, the multi-level transistor fabrication process incorporates formation of openings and filling of those openings to produce interconnect to junctions of the upper/lower transistors. Interconnecting the gate conductors of a pair of stacked transistors and connecting specific junctions of those transistors allows development of a high density NAND gate. The NAND gate includes two pairs of stacked transistors, wherein one transistor of a pair can be connected to the other transistor of that pair or connected to one or both transistors of the other pair.

9 Claims, 5 Drawing Sheets

METHOD OF MAKING AN ULTRA HIGH DENSITY NAND GATE USING A STACKED TRANSISTOR ARRANGEMENT

BACKGROUND OF THE INVENTION

1. Field of the Invention

This invention relates to integrated circuit manufacture and more particularly to transistors formed on separate elevational levels and interconnect arranged between the transistors to configure a NAND gate.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS (NMOS) transistor employs n-type junctions placed into a p-type substrate. Conversely, a typical p-channel MOS (PMOS) transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite the junction in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0μm critical dimension. As feature size decreases, the resulting transistor as well as the interconnect between transistors aim decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefore be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

Before a multi-level transistor fabrication process can be introduced, however, the process must pay careful attention to the interconnection between transistors placed on separate levels. Therefore, it is desirable to derive an interconnect scheme which can connect various features on one elevation (topological) level to features on another level. That interconnection must be as short as possible in order to minimize resistance in critical routing conductors between transistors. The desired fabrication process must therefore incorporate not only multi-level fabrication but also high performance interconnect routing as an essential part of that process.

Most logic block portions of an integrated circuit comprise transistors interconnected in various ways. For example, combinatorial logic includes NAND gates, NOR gates, and inverters connected in various ways to achieve the stated logic goal. Associated with each of these structures are at least two transistors whose gates are mutually connected. Thus, it would be desirable to incorporate the transistor pair on separate elevation levels but with a relatively short interconnect shared by the gate inputs to the transistor pair. For example, an inverter arrangement employs a pair of PMOS and NMOS transistors having a single input conductor linking the gate conductors of the transistor pair. Likewise, NAND and NOR generally employ two pairs of PMOS and NMOS transistors, wherein the gate conductors of each pair are linked by a single input conductor. To operate as a high performance input conductor, the resistance and capacitance of that conductor must be as small as possible to lessen the lead seen by the upstream circuit.

In addition to limiting the routing length of the single input conductor, it would be of further benefit to use short interconnect at linkages to select transistor junctions. For example, interconnecting a junction of one transistor to a junction of another transistor arranged on an altogether different elevation level would be beneficial if the interconnect were designated as an output conductor. Not only must the output conductor be relatively short for performance reasons, but the conductors (power conductors) routed to power junctions and the conductors (ground conductors) routed to ground junctions must also be short. Therefore, similar to the input conductor linking the input pairs of transistors, conductors used to bring an output from a logic gate, or to couple power or ground to the logic gate must operate under high performance conditions with minimal propagation delay, voltage variance/degradation, etc. Without a mechanism to achieve high speed interconnection at mutually connected gate conductors or at mutually interconnected junctions, multi-level fabrication is limited in its appeal.

SUMMARY OF THE INVENTION

The problems outlined above are in large part solved by a multi-level transistor fabrication technique. The present technique can produce one or more active or passive devices on a first level, followed by one or more active or passive devices on a second level. The first level is substantially planar and extends across an entire wafer surface. The second level is also substantially planar and parallel to the first level, but spaced by a dielectric therefrom.

According to a preferred embodiment, the multi-level transistor fabrication technique is suitable for producing at least one transistor on the first level and at least one transistor on the second level. As such, a first transistor can be formed on a first level followed by a second transistor formed on a second level, both of which have gate conductors which are interconnected. The gate conductor of the first transistor extends upward and has an upper surface which can be contacted by a downward extending lower surface of the second transistor gate conductor. Accordingly, the second transistor is inverted relative to the first transistor. The juncture between the first and second transistor gate conductors preferably includes a silicide. The silicide is formed upon the first level transistor polysilicon prior to depositing the second level transistor gate conductor. Silicide interposed between the gate conductors helps to reduce interconnect resistivity for the benefit of achieving a higher performance interconnect.

The process of forming the first and second transistors, and interconnecting the gate conductors of those transistors is replicated and equally applicable to numerous other transistors arranged on the first and second levels. Thus, according to a preferred embodiment, paired gate conductors are interconnected by inverting one transistor of the transistor pair upon the other transistor of the pair. The inverted transistor includes a gate conductor disposed directly on top of its respectively coupled non-inverted transistor.

By interconnecting gate conductor pairs, the present technique is applicable to any logic block which requires mutually connected gate conductors. For instance, the present process is applicable to the interconnection of gate conductors within transistor pairs of a NAND gate. More importantly, however, is the relatively short interconnection used to link the gate conductors. Instead of having to route interconnection along a topological surface as in conventional designs, the present interconnection simply avoids intermediate routing altogether or, at most, simply includes a silicide as the intermediate material. The silicide is preferably used to enhance connectivity by demonstratively reducing the associated resistance and capacitance values (i.e., load) as seen by the upstream circuit.

The present multi-level transistor fabrication technique not only employs low resistance/capacitance gate interconnection between transistors on separate elevational levels, but also advantageously interconnects junction regions of those transistors. Interconnect at select junction regions allows, for example, an upper transistor junction to be connected to a lower transistor junction, a lower transistor junction to be connected to ground or power, and/or an upper transistor junction to be connected to ground or power. In either instance, the interconnection of junction regions is performed by relatively short vertical vias which extend directly through one or more interlevel dielectrics. The vias extend vertically since this is generally the shortest path between junctions arranged on separate elevational levels.

An output conductor is formed, according to a preferred embodiment, between a lower transistor junction and an upper transistor junction. The output conductor is indigenous to the output of a transistor pair found in either an inverter, a NAND gate or a NOR gate. If the output conductor is the output of an inverter, no further coupling is needed. However, if the output conductor is the output of a NAND gate or NOR gate, the output conductor generally requires connection to another output conductor arranged between another pair of multi-level transistors. The output conductor forms an interconnection of the transistor pairs by linking an upper surface of a lower transistor junction to a lateral surface of an upper transistor junctions. The connectable surface of the upper transistor junction is the outer periphery of the junction implant area, that periphery being the lateral outside surface of the junction as measured away from the transistor channel area. Linkage of transistor pair junctions is necessitated by aligning the lateral edge of the upper transistor junction approximately above a middle portion of the lower transistor junction. Interconnecting the junction pairs with the output conductor (i) provides interconnection of drain implant areas within an inverter-coupled pair of transistors, or (ii) provides interconnection of drain implant areas within two pairs of series-connected and parallel-connected transistors of a NAND gate or NOR gate configuration.

Other junction vias besides an output via may be needed to complete the formation of an inverter, NAND gate or NOR gate. For example, a power conductor may extend in a vertical direction to a source junction of a PMOS device, while a ground conductor can extend to a source junction of an NMOS device. The power and ground conductors, like the output conductor, extend in a direct path substantially perpendicular to the elevational levels on which the multi-level transistors are formed. The power and ground conductors can extend through either a single interlevel dielectric or a pair of interlevel dielectrics depending upon whether the to-be-connected target junction is on the upper of lower level transistor.

Broadly speaking, the present invention contemplates a method for forming a NAND gate. The method includes the steps of providing a first substrate having junction regions (source or drain implant areas) placed therein. The junction regions within the first substrate are herein defined as a first source implant and a first drain implant. The first substrate further includes a first gate conductor formed between the first source implant and the first drain implant. A first interlevel dielectric is deposited upon the first source implant, upon the first drain implant and upon the first gate conductor. An opening is formed through the interlevel dielectric to the first gate conductor (preferably a silicide-covered first gate conductor). The opening is then filled with a second gate conductor, and a gate dielectric is then formed upon the second gate conductor. A second substrate is patterned upon the gate conductor, and a second source implant as well as a second drain implant are then configured into the second substrate. A second interlevel dielectric is then deposited on the second substrate. Therefore, the first source and drain implants and the first gate conductor comprise a first transistor, whereas the second source and drain implants, and second gate conductor comprises a second transistor. The above processing steps are repeated to form a third transistor and a fourth transistor. The first transistor is then interconnected in series with the third transistor. Likewise, the second transistor is interconnected in parallel with the fourth transistor. Interconnecting the first and third transistors and second and fourth transistors form a NAND gate having NMOS first and third transistors and PMOS second and fourth transistors, for example.

The present invention further contemplates an integrated circuit. The integrated circuit comprises a first transistor having a first source implant, a first drain implant and a first gate conductor arranged upon a first topography. A third transistor is also arranged upon the first topography. The third transistor includes a third source implant, a third drain implant and a third gate conductor. A first interlevel dielectric extends over the first topography. The first interlevel dielectric includes a pair of openings through the interlevel dielectric which respectively exposed the first gate conductor and the third gate conductor. A second transistor extends over the first interlevel dielectric. The second transistor includes a second gate conductor which extends into one of the openings and abuts with the first gate conductor. A fourth transistor also extends over the first interlevel dielectric. The fourth transistor includes a fourth gate conductor which extends into the other opening onto the third gate conductor such that it abuts with the third gate conductor. An output conductor extends along an axis perpendicular to the first topography in electrical communication with both a lateral edge of the second drain implant and an upper surface of the first drain implant.

The first gate conductor and the third gate conductor extend along the plane above the first source and drain implants and the third source and drain implants, respectively. The second gate conductor and the fourth gate conductor, however, extend along a plane below the second source and drain implants and fourth source and drain implants, respectively. Without having to route intermediate conductive elements along a topological surface, a second gate conductor is brought in electrical communication with the first gate conductor and the fourth gate conductor is brought in electrical communication with the third gate conductor. The second and fourth source and drain implants are doped with an impurity opposite the first and third source and drain implants. Preferably, the second and fourth transistors are PMOS transistors having a source junction connected to power, and the first and third transistors are NMOS transistors having a source junction connected to ground. Accordingly, the NAND gate comprises one pair of PMOS and NMOS transistors interlinked to another pair of PMOS and NMOS transistors. Each pair of transistors share a common gate linkage, and one of the transistor pairs along with one transistor of the other pair is mutually connected to an output conductor at the drain-side junctions of those transistors.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
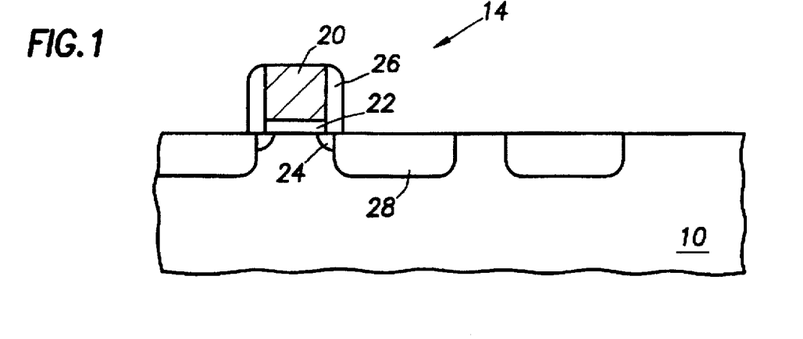
FIG. 1 is a partial cross-sectional view of a semiconductor substrate having a first transistor formed upon and within the semiconductor substrate.

Turning now to the drawings, FIG. 1 illustrates a partial cross-sectional view of a semiconductor substrate 10. Substrate 10 is preferably a icon-based, single crystalline material doped either n-type or p-type. Arranged on the upper surface of substrate 10 can be various isolation structures (not shown). Isolation structures can be formed either by the shallow trench isolation ("STI") process or the LOCOS process. In either event, isolation structures serve to isolate an active or passive device in one portion of substrate 10 from an active or passive device within another portion of substrate 10.

An example of one active device formed between isolation structures is provided in reference to numeral 14. Device 14 is shown as a first transistor formed upon and within the upper surface of substrate 10. First transistor 14 includes, according to one embodiment, a gate conductor 20 and a gate dielectric 22. Gate conductor 20, in combination with adjacent isolation structures, serve to mask implant of a lightly doped drain 24 ("LDD") into the regions therebetween. Thereafter, a CVD oxide is deposited across the topography, including the LDD implant areas 24. The CVD oxide is then removed using an anisotropic etch. Resulting from the anisotropic etch, oxide spacers 26 remain on opposing side wall surfaces of conductor 20. Spacers 26, as well as isolation structures 12, serve to mask implant of source/drain impurities. The source/drain implant 28, in conjunction with LDD implant 24, comprises a junction, wherein the term "junction" conotates either a source region or a drain region.

During the implant process, another implant 29 can be formed. Implant 29 is a region which receives implant species of the same type as those in the bulk of substrate 10. Implant 29 is a high concentration implant area. For example, if substrate 10 comprises p-type species, then implant 29 comprises a higher concentration of p-type species (often referred to as a p$^+$implant). Implant 29 thusly formed is often referred to as a "well-tie" implant. It serves to receive a contact subsequently formed and for providing a low resistive path from the contact to the substrate. Thus, substrate 10 shown in FIG. 1 is possibly only a small portion of the entire wafer substrate, i.e., a well portion of that wafer substrate. The use of wells in general and the formation of a well-tie implant within each well are concepts that are known to those skilled in the art. Provision of webs and contacts thereto make available the present process to CMOS technologies.

Figure 2:
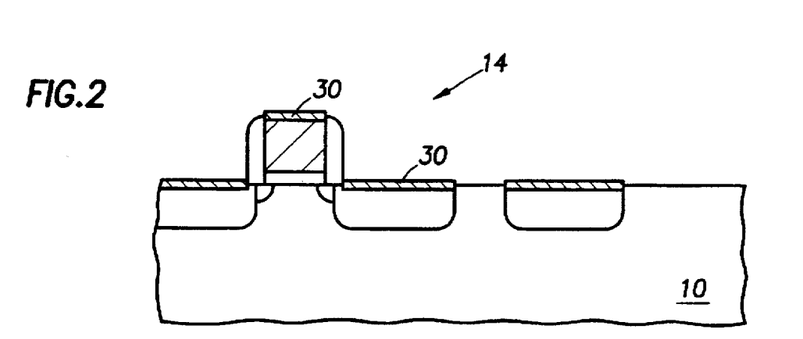
FIG. 2 is a partial cross-sectional view of the semiconductor substrate having silicide formed in silicon-exposed regions according to a processing step subsequent to FIG. 1.

Junction areas serve to receive various silicides shown in reference to FIG. 2. The silicides help reduce contact resistivity of metal conductors forwarded to the junctions. Silicides are shown in reference to as numeral 30, and are formed anywhere where silicon is present. Silicides 30 primarily exist on the silicon-based junctions 28, the silicon based well-ties 29, as well as the polysilicon gate conductor 20. Silicides 30 upon polysilicon are often referred to as "polycide". Regardless of where the silicides are formed, the process sequence used in producing silicide is generally the same. First the silicon-based material receives a refractory metal. Second, the metal covered, silicon-based material is subjected to a high temperature anneal cycle. The anneal cycle allows movement of the silicon and refractory metal atoms so that a metal silicide occurs. The anneal cycle is often repeated to achieve a first phase silicide, followed by a second phase silicide. The second phase silicide is generally of lower resistivity than the first phase silicide. In the interim, however, non-reacted refractory metal is removed from areas typically in regions over oxide.

Figure 3:
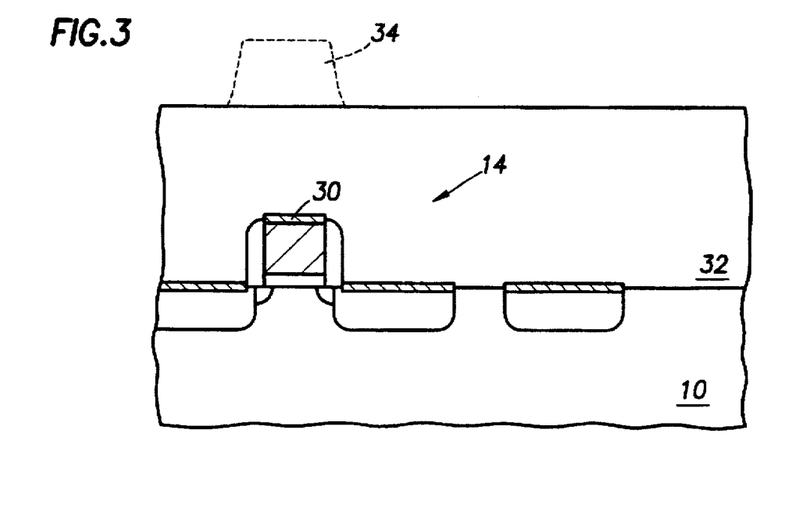
FIG. 3 is a partial cross-sectional view of the semiconductor substrate having a first interlevel dielectric placed over the first transistor according to a processing step subsequent to FIG. 2.

Referring to FIG. 3, a processing step subsequent to FIG. 2 is shown. In particular, FIG. 3 illustrates an interlevel dielectric 32 deposited across the first topography onto which, and into which, first transistor 14 resides. Interlevel dielectric 32 can be deposited in numerous ways. Preferably, dielectric 32 is deposited as an oxide using CVD techniques.

According to one embodiment, dielectric 32 is deposited using plasma enhanced CVD to a thickness sufficient to isolate transistor 14 from certain devices subsequently placed upon and within dielectric 32. Dielectric 32 is also deposited at a thickness sufficient to define the thickness of a subsequently placed gate conductor attributable to a second level transistor.

In preparation for second level devices, dielectric 32 is preferably planarized after it is deposited. According to one embodiment, peak elevation regions 34 of dielectric 32 are removed by chemical mechanical polishing ("CMP"). CMP utilizes a slurry material and a polishing pad placed on the exposed surface, whereby the pad rotates and removes the upper surfaces commensurate with the lower surfaces. According to another embodiment, the upper surfaces 34 are removed using a sacrificial etch back. In this instance, a sacrificial material is placed on the upper surface such that the recesses or valleys are filled with that material. The material upper surface is then removed at an etch rate substantially the same as the dielectric underlayer. When all of the sacrificial material is removed, the remaining dielectric surface is approximately planar in that it takes on the same contours as the planar surface of the sacrificial material.

Figure 4:
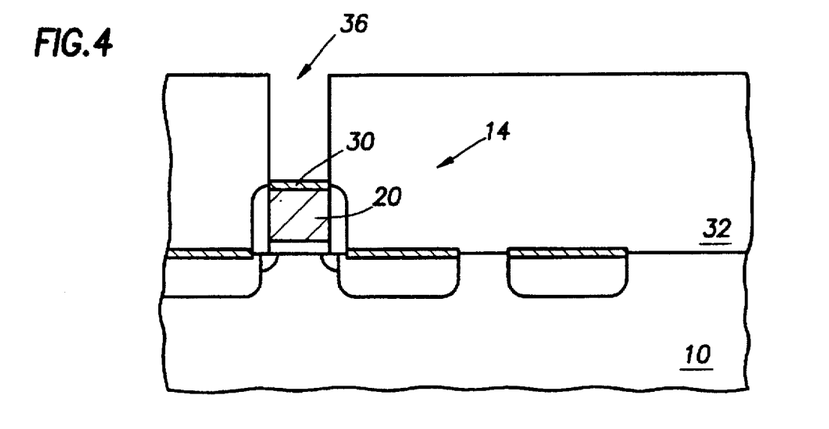
FIG. 4 is a partial cross-sectional view of the semiconductor substrate having an opening formed through the interlevel dielectric to a silicide region formed at the upper surface of the first transistor gate conductor according to a processing step subsequent to FIG. 3.

Referring to FIG. 4, a processing step subsequent to FIG. 3 is shown. FIG. 4 depicts an opening 36 which extends entirely through interlevel dielectric 32 to the upper surface of silicide 30. Opening 36 is contained only to the silicide upon the first transistor gate conductor 20. Opening 36 is produced by placing a masking layer across dielectric 32 and then patterning the masking layer such that the region to be opened is exposed. The exposed region is then subjected to an etch which, according to one embodiment, is a dry (anisotropic) etchant.

The etchant cycle continues for a time sufficient to remove all of interlevel dielectric 32 directly above silicide 30. The etchant composition is chosen so that it is selective to removing dielectric 32 but to a lesser degree silicide 30. Various etchant species used for achieving that purpose are generally well known, all of which achieve a fairly straight side wall surface characteristic of an anisotropic etch.

Figure 5:
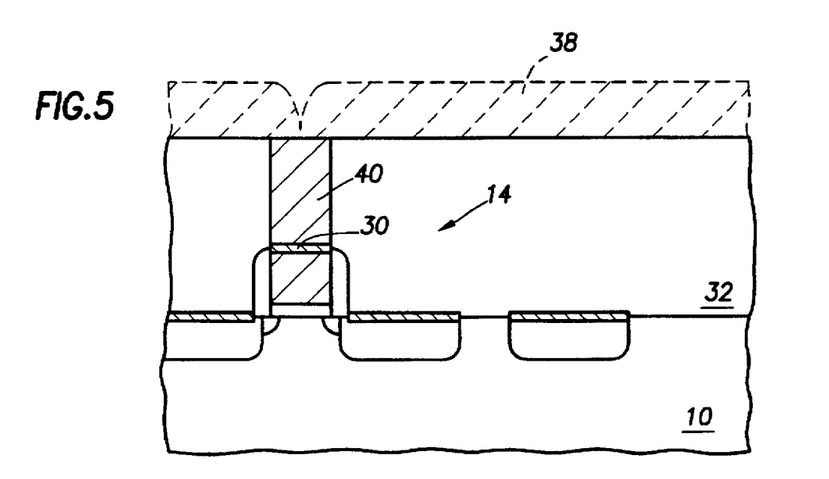
FIG. 5 is a partial cross-sectional view of the semiconductor substrate having polysilicon deposited into the opening and subsequently removed from the interlevel dielectric surface according to a processing step subsequent to FIG. 4.

Referring to FIG. 5, opening 36 is filled with a polycrystalline ("polysilicon") material 38. Polysilicon 38 fills opening 36 by blanket depositing a layer of polysilicon to a thickness which is greater than the depth of opening 36. Thereafter, the upper regions of the polysilicon layer are removed using, for example, CMP. Removal continues for a time sufficient to retain polysilicon 38 only within the confines of opening 36. The retained polysilicon 38 is henceforth referred to as the gate conductor 40 era second, upper level transistor. After CMP, a blanket implant is performed to dope polysilicon 38 to render it conductive.

Figure 6:
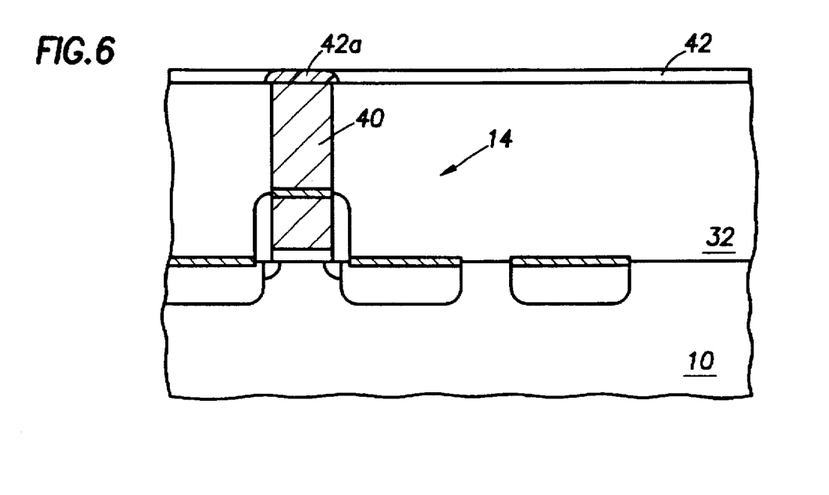
FIG. 6 is a partial cross-sectional view of the semiconductor substrate having a gate dielectric formed upon the retained polysilicon and, if desired, also upon the interlevel dielectric adjacent the retained polysilicon according to a processing step subsequent to FIG. 5.

FIG. 6 illustrates a processing step subsequent to FIG. 5 wherein a dielectric 42 is formed across the upper surfaces of interlevel dielectric 32 and gate conductor 40, according to one embodiment. Dielectric 42 can be CVD deposited. The deposited dielectric may be chosen to contain a nitrogen species. According to another embodiment, dielectric 42 is formed only in regions directly above gate conductor 40. In the later instance, dielectric 42 is denoted as reference numeral 42a, wherein dielectric 42a can be grown from the silicon-based gate conductor 40. Regardless of the method used in producing dielectric 42 and/or 42a, the result is the same: to separate gate conductor 40 from a overlying substrate produced in accordance with the processing step shown in FIG. 7.

Figure 7:
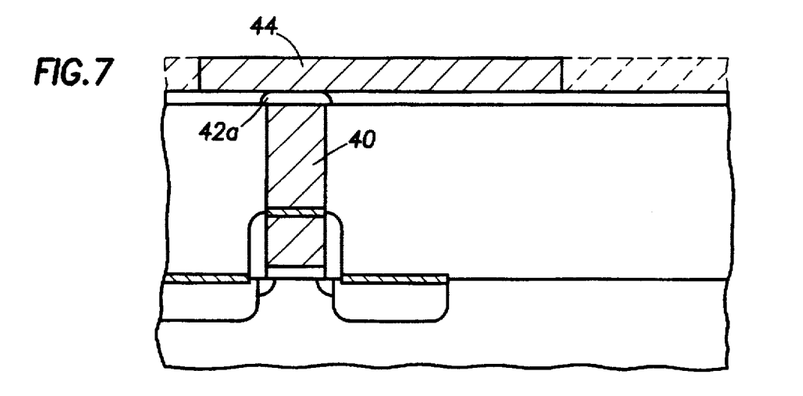
FIG. 7 is a partial cross-sectional view of the semiconductor substrate having a polysilicon substrate formed above the second transistor gate conductor as well as upon regions adjacent the gate conductor according to a processing step subsequent to FIG. 6.

FIG. 7 illustrates a silicon-based substrate 44 (or second substrate) formed across only select regions of interlevel dielectric 32. More specifically, substrate 44 is formed by depositing a layer of polysilicon, and then removing portions of that polysilicon except for areas directly above gate conductor 40 and gate dielectric 42a. The retained portions of polysilicon substrate 44 is centered directly above gate conductor 40 and gate dielectric 42, but also extends laterally from the upper surfaces of the gate dielectric. The mount of lateral extension onto adjacent interlevel dielectric 32 can vary. Substrate 44 is defined as having a thickness sufficient to receive source/drain junction implants which extend downward to the bottom surface of substrate 44, or lower. If desired, and it usually is desired, a threshold adjust implant and possibly a punch through implant is incorporated into substrate 44 prior to source/drain formation.

Figure 8:
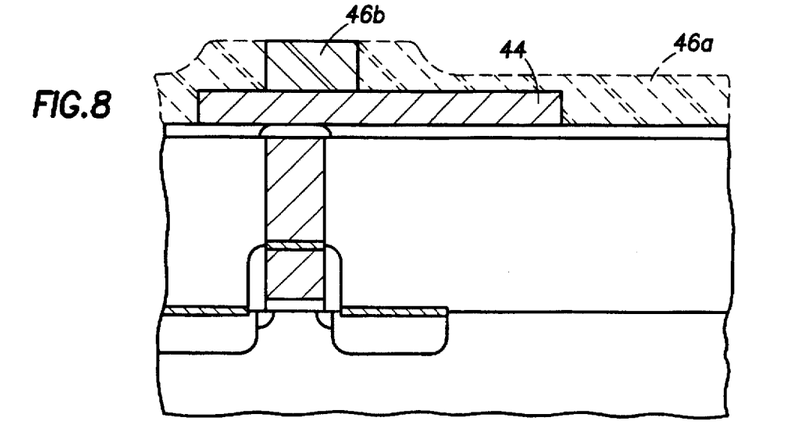
FIG. 8 is a partial cross-sectional view of the semiconductor substrate having a masking material patterned in a limited region near the center of the substrate according to a processing step subsequent to FIG. 7.

FIG. 8 depicts a processing step whereby a masking material 46 is deposited across the entire upper topography. Portions of that masking material are removed, and those portions are designated as reference numeral 46a. The retained portions 46b, however, exist only upon substrate 44. Retained masking material 46b exists only along a center region of substrate 44. The extremities of substrate 44 are thereby exposed as shown in FIG. 9.

Figure 9:
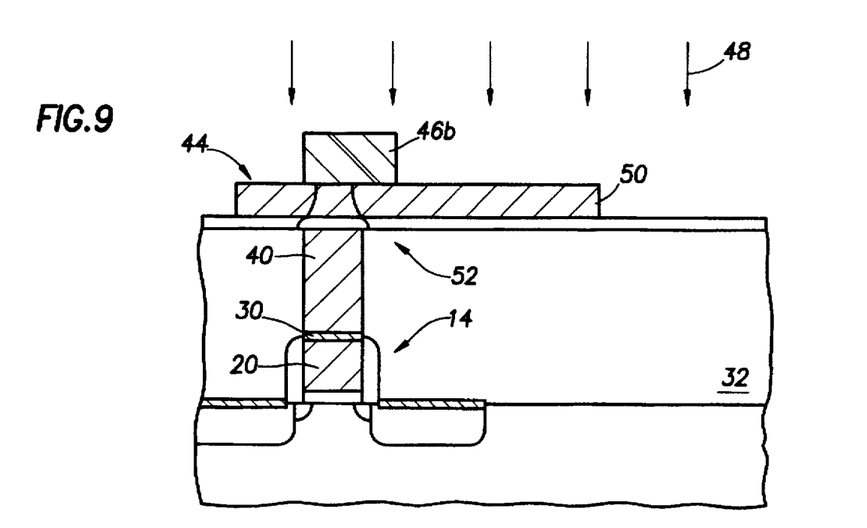
FIG. 9 is a partial cross-sectional view of the semiconductor substrate having implant species forwarded into the substrate in regions void of the masking material to conclude formation of the second transistor according to a processing step subsequent to FIG. 8.

FIG. 9 illustrates a processing step subsequent to FIG. 8, wherein source/drain implants are forwarded into substrate 44 in regions void of retained masking material 46b. Implants 48 extend into substrate 44 and form source/drain junctions 50. Junctions 50, in combination with gate conductor 40 and gate dielectric 42a, comprise a second transistor 52. Second transistor 52 comprises essentially the same features as first transistor 14. However, those features are inverted relative to the order in which features of first transistor 14 are formed. Further, features of second transistor 52 are confined entirely within or below substrate 44.

For sake of clarity, gate conductors 20 and 40 are not drawn to scale. The topological thickness and area of polysilicon which form those conductors can be adjusted depending upon the size of transistors 14 and 52 as well as the thickness of interlevel dielectric 32. It is not imperative that the relative features be drawn to scale or that dimensions be specified, all of which would be readily apparent to those skilled in the art given the benefits described herein. What is necessary, however, is that the second level gate conductor 40 be adjoined to first level gate conductor 20 with substantially no intermediate interconnect other than silicide 30. Further, the electrical connection between the gate conductors is made in the shortest possible manner. Rather than having to route the gate conductor of one transistor laterally across a topological surface to a gate conductor of another transistor, the gate conductors herein are stacked one upon each other using an inverted second transistor. Connection to the stacked gate conductors is performed in a dimension either behind or in front of the cross-sectional plane shown in FIG. 9.

Substrate 44 of second transistor 52 receives various dopants to render the substrate (or well) semiconductive. Preferably, substrate 44 comprises polysilicon, and polysilicon is exposed along a separate surface to receive all the various implants necessary to form junctions and channels. According to an alternative embodiment, substrate 44 can, if desired, be forwarded into the opening 36 shown in FIG. 4. Substrate 44 therein can receive dopants using a masking layer similar to the step shown in FIG. 9. In this alternative arrangement, the second substrate 44 is confined within the opening directly upon gate conductor 20. Thus, instead of using a silicide 30, the latter arrangement forgoes silicide and allows growth of a gate oxide instead. The gate oxide is therefore drawn between the shared gate conductor 20 and the substrate material deposited into opening 36. In this configuration, only a single polysilicon gate conductor 20 need be fabricated. While the alternative configuration may be used, it is desired that a silicide be used, and two gate conductors 20 and 40 be arranged on opposing sides of the silicide 30. Moreover, it is desirable that second substrate 44 be dimensioned outside of opening 36 into which second gate conductor 40 exists.

Figure 10:
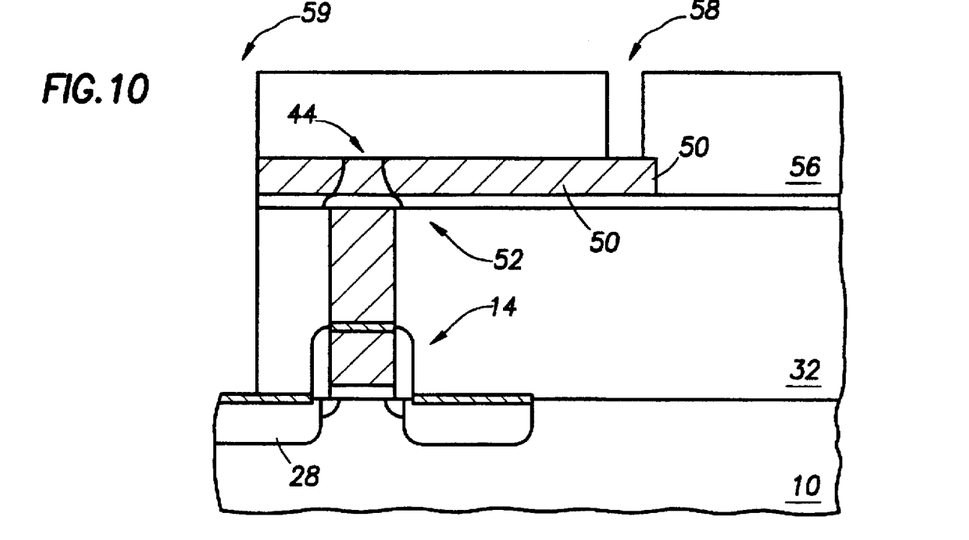
FIG. 10 is a partial cross-sectional view of the semiconductor substrate having the masking material entirely removed and a second interlevel dielectric placed upon and selectively removed according to a processing step subsequent to FIG. 9.

FIG. 10 illustrates a processing step subsequent to FIG. 9 whereby another interlevel dielectric 56 can be fashioned upon second transistor 52 and the lateral topography into which and upon which transistor 52 occurs. Dielectric 56 can be planarized, similar to the technique used to planarize dielectric 32. Accordingly, dielectric 56 affords an opportunity to introduce openings 58 to junctions 50 of the upper transistor as well as openings 59 to junctions 28 of the lower transistor. There may be further openings which can extend to the upper surface of a well-tie area, if present, within substrate 10. Depending upon where contact is to be made, the vertical distance of openings 58 and 59 can vary. However, in each case, the length of the various openings depend upon the thickness of first and second interlevel dielectrics 32 and 56, respectively.

Figure 13:
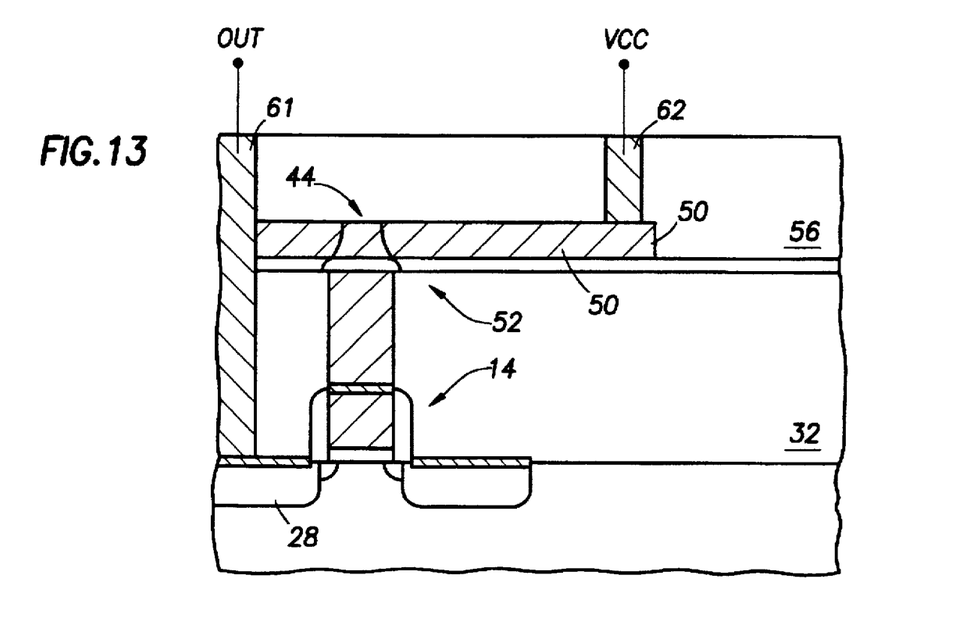
FIG. 13 is a partial cross-sectional view alone plane 13—13 of FIG. 11 showing conductive material deposited in the removed regions to form junction vias (i.e., an output conductor, power conductor and ground conductor) according to a processing step subsequent to FIG. 10.

Openings 58 and 59 are filled with conductive material as shown in FIG. 13. Filling the openings form junction vias which are electrically conductive. The conductive vias serve as interconnect which extend along a vertical axis (or along an axis perpendicular to the topological surfaces on which transistors 14 and 52 exist). The interconnect serves to couple a junction of a lower level transistor to a junction of an upper level transistor, couple a junction of an upper or lower transistor to a power supply, and couple a junction of an upper or lower transistor to ground. The various conductors formed by filling openings 58 and 59 are shown as output and power (VCC) conductors. In the illustration provided, only an output and power conductor 61 and 62 are brought forth. However, it is understood that the cross-section shown in FIG. 13 is indicative of only a portion of a NAND gate depicted in elevational view. FIG. 13 thereby illustrates only one pair of transistors which make up a two transistor NAND gate. Likewise, FIG. 13 illustrates connection of a power conductor, whereas another cross-section of a NAND gate may indicate the ground connection. It is understood that the source junction area of an NMOS transistor, such as transistor 14, is connected to such a ground conductor.

Figures 11, 12:
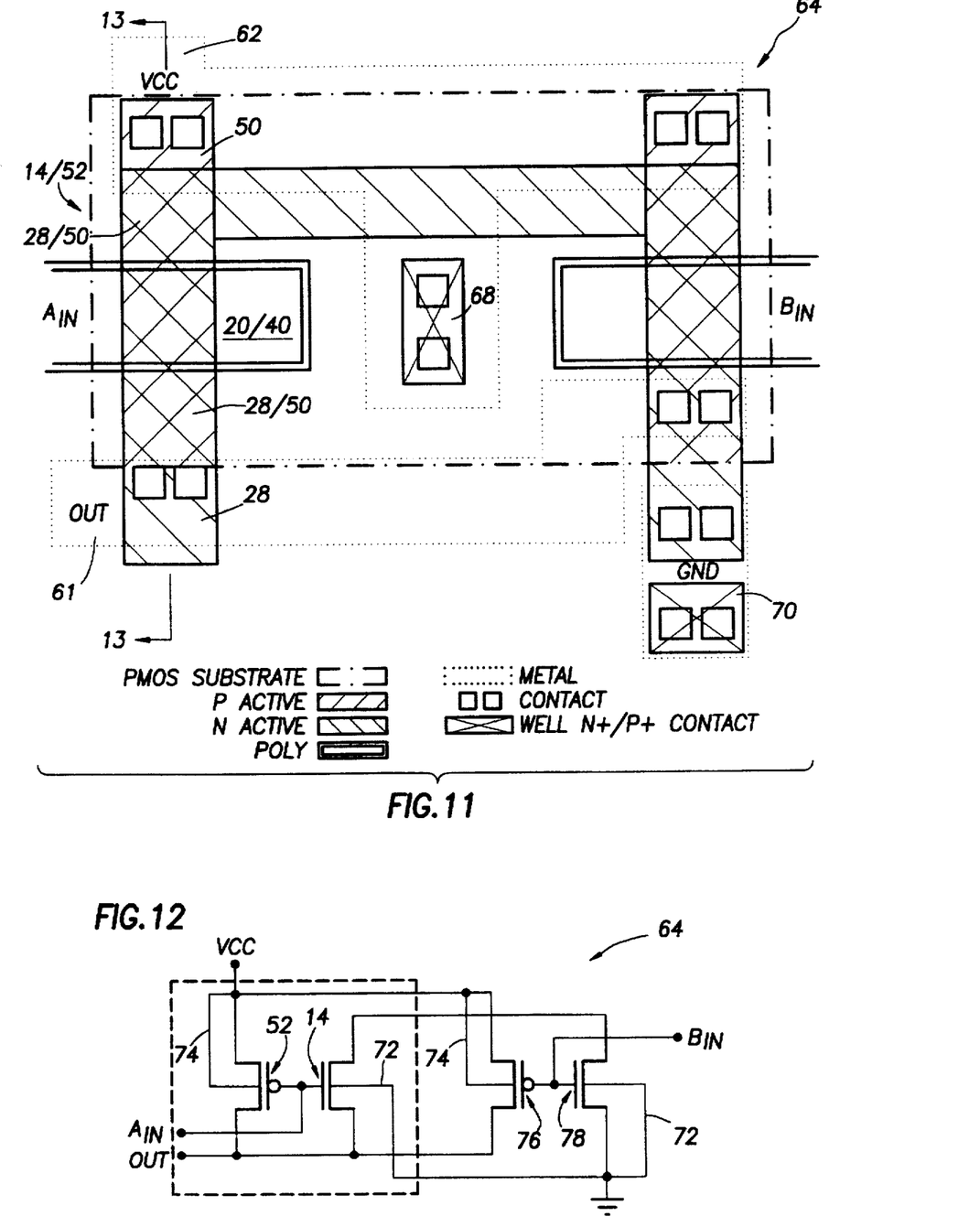
FIG. 11 is a top plan of various features interconnected to form a NAND gate according to the present processing steps.
FIG. 12 is a circuit schematic of the NAND gate shown in FIG. 11.

FIG. 11 illustrates a top plan view of a NAND gate 64 formed according to the processing steps set forth above. NAND gate 64 includes a pair of stacked transistors 14 and 52 modulated by a first gate conductor 20 and a second gate conductor 40. The cross-sectional detail of transistor 14 and 52 as shown in FIG. 13 are presented along the plane 13—13 of FIG. 11. For example, FIG. 11 depicts output conductor 61 and, more specifically, the junction via which extends output conductor 61 to both the lateral edge of upper transistor junction 50 and the upper surface of lower transistor junction 28. FIG. 11 also illustrates coupling of power conductor 62 to junction 50 but not to junction 28. The cross-hatching of the P-type source/drain ("P active") and N-type source/drain ("N active active") makes clear the demarcation of output conductor 61/power conductor 62 connectivity. It is noted that the stacking of transistors shown at the left-hand side of FIG. 11 is repeated at the right-hand side. The right-hand side not only shows a pair of stacked transistors linked to those stacked at the left-hand side but also shows metal contacts of power and ground to respective well regions of PMOS and NMOS transistors. The PMOS and NMOS power and ground well-ties are shown in reference to numerals 68 and 70. Coupling the wells to appropriate power and ground conductors affords biasing the "body" of NMOS transistors to a ground voltage while also biasing the body of PMOS transistors to a VCC voltage. Biasing the body causes a change in the workfunction difference between the gate material and the bulk silicon in the ensuing channel. In essence, biasing the body of a voltage more to ground voltage will force the threshold voltage more positive. Conversely, biasing the body of a PMOS device to a power voltage will force threshold voltage more negative. More importantly, in both instances, biasing the body will force the threshold voltage to be more consistent from transistor to transistor given the relatively constant bias being applied to the respective transistor body. A consistent ram-on threshold that does not deteriorate at smaller geometries is at least one benefit provided by grounding the body or well of an NMOS transistor and powering the body or well of a PMOS transistor.

FIG. 11 depicts but one example of various features era NAND gate and a layout of those features with respect to one another. It is apparent from FIG. 11 that two pairs of transistors are needed to form a NAND gate. Each pair comprises a transistor inverted directly upon a non-inverted transistor. Routing a junction of one transistor within one of the pairs to another transistor within the same pair or to another pair occurs by using contacts to an overlying metal layer or by laterally extending the junction within the same elevational plane to another junction associated with another transistor pair. Various permutations or variations may be made to the layout arrangement. All of this would be obvious to a skilled artisan given the benefit of the present description. Accordingly, a cross-section through the stacked pair of transistors on the right-hand side of FIG. 11 would be somewhat similar to the cross-section shown in FIG. 13 with modifications apparent given the top-plan view of FIG. 11.

Turning now to FIG. 12, a circuit schematic of NAND gate 64 is illustrated. The circuit schematic illustrates biasing NMOS transistor bodies 72 to ground and biasing PMOS transistor bodies 74 to power. FIG. 12 also illustrates the two pair of stacked transistors shown in dashed line as numerals 14 and 52. Transistor 14 is illustrated as being an NMOS transistor while transistor 52 is a PMOS transistor, for example. Accordingly, the transistor layout and the general interconnect arrangement of the circuit schematic follows to some degree the layout shown in FIG. 11 in that transistor 14 and 52 represent the stacked transistors on the left-hand side of FIG. 11 and transistors 76 and 78 represent stacked transistors on the right-hand side. Input B IN modulates transistors 76 and 78, while input A IN modulates transistors 14 and 52.

A NAND gate 64 is shown having two pairs of stacked transistors. Depending upon the number of levels needed, numerous other transistors can therefor be stacked almost endlessly into a third dimension to allow a multi-level device fabrication thereof. It will be appreciated to those skilled in the art having the benefit of this disclosure that the present process methodology is capable of producing numerous NAND gates in three dimensions. Preferably, a PMOS device is stacked directly upon an NMOS device, yet inverted from that NMOS device. Alternatively, a NMOS can be stacked (and inverted) upon a PMOS device. In either instance, stacking PMOS snd NMOS devices affords ready linkage of their gates and interconnect of their junctions amongst one another and to the power and ground conductors associated with the ensuing wafer. Thus, the first and second transistor shown in the above figures are of opposite type so that gate conductor 40 of second transistor 52 is doped opposite gate conductor 20 of first transistor 14. The same can be true of a third and fourth transistor with common gates linking one another in the shortest possible fashion. The third and fourth transistors are of opposite type, similar to the first and second transistors, so that the corresponding gate conductors are doped opposite one another to ensure ohmic contact at silicide formed therebetween. This ohmic contact provides that both polysilicon gates will be at the same bias—a desired outcome in circuit applications.

Various modifications and changes may be made to each and every processing step without departing from the spirit and scope of the invention provided the interconnect concepts set forth in the claims are retained. It is intended that the following claims be interpreted to embrace all such modifications and changes, and accordingly, the specification and drawings are to be regarded in an illustrative rather than a restrictive sense.

What is claimed is:

1. A method for forming a NAND gate within an integrated circuit, comprising:

providing a first transistor having a first gate conductor arranged upon a first substrate between a first source implant and a first drain implant;

depositing a first interlevel dielectric upon the first source implant, upon the first drain implant and upon the first gate conductor;

forming an opening through said first interlevel dielectric to said first gate conductor;

filling said opening with a second gate conductor;

forming a gate dielectric upon said second gate conductor;

patterning a second substrate upon said gate dielectric;

implanting a second source implant and a second drain implant into said second substrate to form a second transistor;

depositing a second interlevel dielectric upon and laterally adjacent said second transistor;

repeating the above steps to form a third transistor and a fourth transistor; and interconnecting said first transistor in series with said third transistor and interconnecting said second transistor in parallel with said fourth transistor to form said NAND gate.

2. The method as recited in claim 1, further comprising interconnecting the first transistor with the second transistor by forming an output conductor of the NAND gate which extends through said first and second interlevel dielectrics and abuts against both said first and second drain implants, while simultaneously forming a power conductor of said NAND gate which extends through said first interlevel dielectric to said second source implant.

3. The method as recited in claim 1, wherein said first substrate comprises substantially single crystalline silicon, and wherein said second substrate comprises substantially polycrystalline silicon.

4. The method as recited in claim 1, wherein said first and third transistor comprise NMOS transistors, and said second and fourth transistors comprise PMOS transistors.

5. The method as recited in claim 2, wherein said forming the output conductor comprises removing said first and second interlevel dielectrics along an axis perpendicular to an upper surface of said first substrate to expose a lateral surface of said second substrate and an upper surface of said first drain implant.

6. The method as recited in claim 2, wherein said output conductor and said power conductor extend substantially parallel to each other.

7. The method as recited in claim 1, further comprising forming a silicide upon said first source implant, said first drain implant and said first gate conductor prior to said depositing the first interlevel dielectric.

8. The method as recited in claim 1, wherein said forming the gate dielectric comprises thermally growing an oxide upon said second gate conductor.

9. The method as recited in claim 1, further comprising providing a well-connect implant within said first substrate a spaced distance from said first drain and source implants.

* * * * *